United States Patent
Lin

(10) Patent No.: US 7,446,687 B2
(45) Date of Patent: Nov. 4, 2008

(54) METHOD AND APPARATUS TO REDUCE INTERNAL CIRCUIT ERRORS IN A MULTI-BIT DELTA-SIGMA MODULATOR

(75) Inventor: Chia-Liang Lin, Union City, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/856,638

(22) Filed: Sep. 17, 2007

(65) Prior Publication Data

US 2008/0100486 A1 May 1, 2008

Related U.S. Application Data

(60) Provisional application No. 60/863,134, filed on Oct. 27, 2006.

(51) Int. Cl.
*H03M 3/00* (2006.01)
(52) U.S. Cl. .................. 341/143; 341/118; 341/120; 341/155
(58) Field of Classification Search .............. 341/118, 341/120, 143, 155
See application file for complete search history.

(56) References Cited

U.S. PATENT DOCUMENTS

| | | |
|---|---|---|
| 4,441,136 A | 4/1984 | Hampshire |
| 4,558,361 A | 12/1985 | Catros |
| 4,700,173 A | 10/1987 | Araki et al. |
| 4,751,496 A | 6/1988 | Araki |
| 4,943,807 A | 7/1990 | Early et al. |
| 5,012,244 A | 4/1991 | Wellard et al. |
| 5,187,482 A | 2/1993 | Tiemann et al. |
| 5,404,142 A | 4/1995 | Adams et al. |

(Continued)

FOREIGN PATENT DOCUMENTS

EP     0084353  A2     7/1983

(Continued)

OTHER PUBLICATIONS

Paton, Susan, et al., "A 70 -mW 300 MHz CMOS Continuous-Time SD ADC with 15 MHz Bandwidth and 11 Bits of Resoulation," IEEE Journal of Solid State Circuits, vol. 39, No. 7, Jul. 2004.

(Continued)

*Primary Examiner*—Linh V Nguyen
(74) *Attorney, Agent, or Firm*—Knobbe, Martens, Olson & Bear LLP

(57) ABSTRACT

An N-bit delta-sigma modulator reduces circuit errors associated with an internal N-bit digital-to-analog converter by replacing the N-bit digital-to-analog converter with a digital feedback circuit comprising a ternary digital-to-analog converter and an (N−1)-bit digital-to-analog converter. The internal N-bit digital-to-analog converter is typically used to generate a global feedback signal that is provided to a first summation circuit. To provide an equivalent function but with better noise transfer characteristics, the digital feedback circuit generates two feedback signals. The ternary digital-to-analog converter is part of a first feedback path that generates a first feedback signal for the first summation circuit, and the (N−1)-bit digital-to-analog converter is part of a second feedback path that generates a second feedback signal for the first summation circuit or a subsequent summation circuit.

20 Claims, 7 Drawing Sheets

U.S. PATENT DOCUMENTS

| | | | |
|---|---|---|---|
| 5,416,481 A | 5/1995 | Chen | |
| 5,684,482 A | 11/1997 | Galton | |
| 5,729,230 A | 3/1998 | Jensen et al. | |
| 5,835,038 A | 11/1998 | Nakao et al. | |
| 5,889,482 A | 3/1999 | Zarubinsky | |
| 5,982,313 A * | 11/1999 | Brooks et al. | 341/143 |
| 6,016,113 A | 1/2000 | Binder | |
| 6,064,871 A | 5/2000 | Leung | |
| 6,087,969 A | 7/2000 | Stockstad et al. | |
| 6,150,969 A * | 11/2000 | Melanson | 341/143 |
| 6,184,812 B1 | 2/2001 | Younis et al. | |
| 6,271,782 B1 | 8/2001 | Steensgaard-Madsen | |
| 6,304,608 B1 | 10/2001 | Chen et al. | |
| 6,346,898 B1 | 2/2002 | Melanson | |
| 6,351,229 B1 | 2/2002 | Wang | |
| 6,362,762 B1 * | 3/2002 | Jensen et al. | 341/143 |
| 6,362,763 B1 | 3/2002 | Wang | |
| 6,396,428 B1 | 5/2002 | Cheng | |
| 6,414,615 B1 * | 7/2002 | Cheng | 341/143 |
| 6,445,318 B1 | 9/2002 | Ruha et al. | |
| 6,462,685 B1 | 10/2002 | Korkala | |
| 6,473,019 B1 | 10/2002 | Ruha et al. | |
| 6,642,874 B1 * | 11/2003 | Lin et al. | 341/143 |
| 6,657,500 B1 | 12/2003 | Chen | |
| 6,670,902 B1 | 12/2003 | Melanson et al. | |
| 6,674,381 B1 * | 1/2004 | Gomez et al. | 341/143 |
| 6,680,682 B2 | 1/2004 | Arnaud et al. | |
| 6,693,572 B1 | 2/2004 | Oliaei et al. | |
| 6,765,517 B1 | 7/2004 | Ali | |
| 6,791,400 B2 | 9/2004 | Lou | |
| 6,838,929 B2 | 1/2005 | Mitteregger | |
| 6,880,262 B1 | 4/2005 | Jensen | |
| 6,930,624 B2 | 8/2005 | Hezar et al. | |
| 6,940,434 B2 | 9/2005 | Brooks | |
| 6,954,161 B2 * | 10/2005 | Inukai et al. | 341/143 |
| 6,980,144 B1 * | 12/2005 | Maloberti et al. | 341/143 |
| 6,980,145 B1 | 12/2005 | Tammineedi | |
| 7,042,375 B1 | 5/2006 | van Engelen | |
| 7,095,345 B2 | 8/2006 | Nguyen et al. | |
| 7,098,730 B1 | 8/2006 | Shui | |
| 7,129,873 B2 | 10/2006 | Kawamura | |
| 7,158,063 B2 * | 1/2007 | Motz et al. | 341/143 |
| 7,339,510 B2 * | 3/2008 | Zierhofer | 341/143 |
| 7,388,533 B2 * | 6/2008 | Kim et al. | 341/150 |
| 2002/0175846 A1 * | 11/2002 | Sakimura | 341/143 |
| 2005/0030212 A1 | 2/2005 | Brooks | |
| 2005/0128111 A1 | 6/2005 | Brooks | |
| 2006/0139109 A1 | 6/2006 | Oustaloup et al. | |
| 2007/0216557 A1 * | 9/2007 | Ebner et al. | 341/143 |

FOREIGN PATENT DOCUMENTS

| | | |
|---|---|---|
| EP | 0964524 A2 | 12/1999 |
| EP | 1418674 A1 | 5/2004 |
| JP | 60263534 A | 6/1984 |
| JP | 2003258644 | 9/2003 |
| WO | WO 00/63786 A | 10/2000 |

OTHER PUBLICATIONS

Yan, Shouli, et al., "A Continuous-Time SD Modulator with 88-dB Dynamic Range and 1.1-MHz Signal Bandwidth," IEEE Journal, on Solid State Circuits, vol. 39, No. 1, Jan. 2001.

Xia, Bo et al., An RC Time Constant Auto-Tuning Structure for High Linearity Continuous-Time Modulators and Active Filters, IEEE Transactions on Circuits and Systems, pp. 2179-2188, I: Regular Papers, vol. 51, No. 11, Nov. 2004.

Norsworthy S R et al.: "Delta-Sigma Data Converters" Delta-Sigma Data Converters. Theory Design, and Simulation, New York, NY: IEEE, US, 1997, pp. 197-199, 309-313, XP002322216 ISBN: 0-7803-1045-4.

Norsworthy S R et al. Institute of Electrical and Electronics Engineers: "Effective Dithering of Sigma-Delta Modulators" Proceedings of the International Symposium on Circuits and Systems. (ISCAS), New York, IEEE, US, vol. vol. 4 Conf. 25, May 3, 1992, pp. 1304-1307, XP010061387 ISBN: 0-7803-0593-0.

Silva,J. et al., "Wideband low-distortion delta-sigma ADC topology". Electronics Letters, Jun. 7, 2001, vol. 37, No. 12, pp. 737-738.

Wu, X., et al., "One-bit processing for digital control". IEE Proc.-Control Theory Appl., vol. 152, No. 4, Jul. 2005, pp. 403-410.

* cited by examiner

US 7,446,687 B2

METHOD AND APPARATUS TO REDUCE INTERNAL CIRCUIT ERRORS IN A MULTI-BIT DELTA-SIGMA MODULATOR

The present application claims priority benefits under 35 U.S.C. §119(e) from U.S. Provisional Application No. 60/863,134, filed on Oct. 27, 2006, entitled "Multi-Bit Delta-Sigma Modulator and Method Thereof," the entirety of which is incorporated herein by reference.

BACKGROUND OF THE INVENTION

1. Field of the Invention

The present invention relates to delta-sigma modulators and in particular to multi-bit delta-sigma modulators that employ spectral shaping of circuit errors in internal digital-to-analog converters.

2. Description of the Related Art

Over-sampling delta-sigma modulators are widely used in prior art to achieve high-resolution analog-to-digital conversion despite using a coarse quantizer. FIG. 1 depicts a functional block diagram of a typical second order delta-sigma modulator 100 comprising: a first summation circuit 110 for subtracting a first feedback signal (or global feedback signal) $f_1(n)$ from a modulator input signal $x(n)$; a first integrator 120 having a transfer function of approximately $0.5z^{-1}/(1-z^{-1})$ for integrating an output of the first summation circuit 110; a second summation circuit 130 for subtracting a second feedback signal $f_2(n)$ from an output of the first integrator 120; a second integrator 140 having a transfer function of approximately $2z^{-1}/(1-z^{-1})$ for integrating an output of the second summation circuit 130; an N-bit quantizer (e.g., analog-to-digital converter or ADC) 150 for digitizing an output of the second integrator 140 into an N-bit modulator output signal $y(n)$; a first N-bit digital-to-analog converter (or DAC) 170 for converting $y(n)$ into the first feedback signal $f_1(n)$; and a second N-bit DAC 160 for converting $y(n)$ into the second feedback signal $f_2(n)$.

Throughout this disclosure, "(n)" is used to denote a timing index of states or signals of a discrete-time system. When a sampling rate of a modulator input signal $x(n)$ is much higher than a bandwidth of the information of interest, a delta-sigma modulator can spectrally shape its quantization error and greatly suppress its power in the frequency band of interest. Therefore, the delta-sigma modulator can have a high in-band signal-to-quantization-noise-ratio (SQNR) despite using a coarse quantization (i.e., using a small N for the quantizer 150, the second DAC 160 and the first DAC 170 in FIG. 1). The number of integrators used in a delta-sigma modulator determines an order of the modulator. In general, a higher order modulator allows more aggressive spectral shaping, and thus a better in-band SQNR, but has more instability.

In the early days of the history of delta-sigma modulators, 1-bit data conversion (i.e., N=1 for the quantizer 150, the second DAC 160 and the first DAC 170 in FIG. 1) was widely used. This is because 1-bit data conversion is inherently linear and relatively simple as far as circuit design is concerned. In high-order modulators, however, using single-bit data conversion has many drawbacks (e.g., small usable input range, conditional stability and spurious tonal behavior). The drawbacks can all be greatly alleviated by using multi-bit data conversion (i.e., using N>1). For an ideal N-bit DAC, there are $2^N$ output levels that are uniformly spaced. In practice, however, these $2^N$ output levels cannot be perfectly uniformly spaced due to mismatches among circuit elements under a limited tolerance in manufacturing. The non-uniformity (or alternatively described as non-linearity) of a DAC used in a delta-sigma modulator results in a source of circuit errors, which unlike the quantization error, cannot be effectively suppressed by the delta-sigma modulator.

While there have been many works in the prior art that address the problem of circuit errors in a multi-bit DAC used in a delta-sigma modulator, these works generally involve extensive usage of complex digital algorithms. As a result, they are not highly amenable to very high-speed applications. What is needed is a simple digital algorithm to effectively suppress the circuit errors caused by the non-linearity of a multi-bit DAC in a delta-sigma modulator.

SUMMARY OF THE INVENTION

The present invention solves these and other problems by providing a multi-bit delta-sigma modulator that uses a digital circuit comprising a ternary DAC to generate a feedback signal, thereby reducing non-linearity errors typically associated with a multi-bit feedback DAC. In one embodiment, the multi-bit delta-sigma modulator comprises a first summation circuit, a first integrator circuit, a second summation circuit, a filter circuit, a quantizer and a feedback circuit. The first summation circuit generates a first intermediate signal based on a summation of a first set of signals that includes a modulator input signal and a first feedback signal. The first integrator circuit integrates the first intermediate signal to generate a first integrated signal. The second summation circuit generates a second intermediate signal based on a weighted sum of a second set of signals that includes the first integrated signal and a second feedback signal. The filter circuit includes a second integrator circuit and processes the second intermediate signal to generate a filtered signal. The quantizer digitizes the filtered signal to generate an N-bit (or multi-bit) modulator output signal (e.g., N is an integer greater than one).

The feedback circuit receives the N-bit modulator output signal to generate the first feedback signal using a ternary DAC in a first feedback path. The feedback circuit further comprises an (N−1)-bit DAC in a second feedback path. In one embodiment, the second feedback path generates an additional feedback signal that is provided as part of the first set of signals to the first summation circuit. In another embodiment, the second feedback path generates the second feedback signal that is provided to the second summation circuit.

In one embodiment, the feedback circuit further comprises an (N−1)-bit accumulator that receives (N−1)-bit least significant bits of the N-bit modulator output signal. The accumulator comprises an (N−1)-bit adder and a delay element to generate an (N−1)-bit cumulative sum signal and a 1-bit carry signal. A 1-bit adder receives the 1-bit carry signal and a most significant bit of the N-bit modulator output signal to generate a 2-bit ternary signal that is provided as an input to the ternary DAC in the first feedback path to generate the first feedback signal. In one embodiment, an output of the (N−1)-bit adder is provided as an input to the (N−1)-bit DAC and an output of the (N−1)-bit DAC is provided to a differentiator to generate the additional feedback signal for the first summation circuit. In another embodiment, a delayed version of the output of the (N−1)-bit adder is provided to the (N−1)-bit DAC and an output of the (N−1)-bit DAC is multiplied by a scaling factor to generate the second feedback signal for the second summation circuit.

In one embodiment, the second set of signals further includes a third feedback signal. For example, an N-bit DAC can be configured to receive the N-bit modulator output signal and to generate the third feedback signal that is provided to the second summation circuit. Additional feedback paths coupled between the modulator output and one of the summation circuits or the filter circuit are possible.

In one embodiment, the filter circuit further includes a third summation circuit that is configured to generate a third intermediate signal based on a weighted sum of a third set of signals including an output of the second integrator circuit and an input of the second integrator circuit. Alternately, the third set of signals can include the output of the second integrator circuit and an output of the second summation circuit. Other feed forward compensation paths that bypass one or more of the summation circuits are also possible.

In one embodiment, the filter circuit includes at least one additional summation circuit and at least one additional integrator circuit to increase an order of the multi-bit delta-sigma modulator. The integrators in the multi-bit delta-sigma modulator can be continuous-time integrators or discrete-time integrators. For example, a discrete-time integrator can be a differential switch-capacitor integrator implemented using a pair of input capacitors, a differential operational amplifier, a pair of feedback capacitors, and a plurality of switches controlled by a plurality of clock signals. In one embodiment, the first summation circuit is combined with the first integrator circuit in a single differential switch-capacitor circuit with a first pair of capacitors coupled to the modulator input signal, a second pair of capacitors coupled to an output of the ternary DAC, a pair of feedback capacitors, a differential operational amplifier and a plurality of switches controlled by a plurality of clock signals. Similarly, the second summation circuit can be combined with the second integrator circuit in a single switch-capacitor circuit with the weighted sum of the second set of signals implemented by setting a capacitor ratio in the single switch-capacitor circuit.

In one embodiment, the ternary DAC is implemented in a differential circuit topology using two 3-to-1 multiplexers. For example, the 2-bit ternary signal provided to the input of the ternary DAC is coupled to select lines of both 3-to-1 multiplexers. Three reference voltages are provided in a different order to input terminals for each of the 3-to-1 multiplexers. The first 3-to-1 multiplexer generates a positive end of a differential signal and the second 3-to-1 multiplexer generates a negative end of the differential signal.

In one embodiment, a method for suppressing circuit errors associated with an N-bit feedback DAC in a multi-bit delta-sigma modulator comprises replacing the N-bit feedback DAC with an (N−1)-bit DAC and a ternary DAC. The method comprises performing a first weighted summation on a first set of signals including a modulator input signal and a first feedback signal to generate a first intermediate signal. The first intermediate signal is then integrated to generate a first integrated signal. The method further comprises performing a second weighted summation on a second set of signals including the first integrated signal and a second feedback signal to generate a second intermediate signal. The second intermediate signal is filtered (e.g., integrated) to generate a filtered signal. The filtered signal is digitized to generate an N-bit modulator output signal with N being an integer greater than one. A cumulative summation on (N−1) least significant bits of the N-bit modulator output signal is performed to generate an (N−1)-bit sum signal and a 1-bit carry signal. The 1-bit carry signal is added to a most significant bit of the N-bit modulator output signal to generate a 2-bit ternary signal. The ternary DAC converts the 2-bit ternary signal into the first feedback signal.

In one embodiment, the (N−1)-bit sum signal is converted into the second feedback signal using a feedback path comprising the (N−1)-bit DAC. For example, an (N−1)-bit adder is used to add the (N−1) least significant bits of the N-bit modulator output signal with the (N−1)-bit sum signal. An output of the (N−1)-bit adder is delayed to generate the (N−1)-bit sum signal that is provided to an input of the (N−1)-bit DAC. An output of the (N−1)-bit DAC may be scaled to generate the second feedback signal. In an alternate embodiment, the output of the (N−1)-bit adder is provided to the (N−1)-bit DAC and the output of the (N−1)-bit DAC is differentiated to generate an additional feedback signal that is combined with the first set of signals to generate the first intermediate signal. Other feedback signals can be generated by performing a digital-to-analog conversion of the N-bit modulator output signal. The multi-bit delta-sigma modulator can also use feed forward compensation to process the modulator input signal.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION OF THE PREFERRED EMBODIMENT

The present invention relates to a method and an apparatus for reducing circuit errors associated with a feedback DAC in a multi-bit delta-sigma modulator. While the specifications describe several example embodiments of the invention, it should be understood that the invention can be implemented in many ways and is not limited to the particular examples described below or to the particular manner in which any features of such examples are implemented.

Figure 2A:
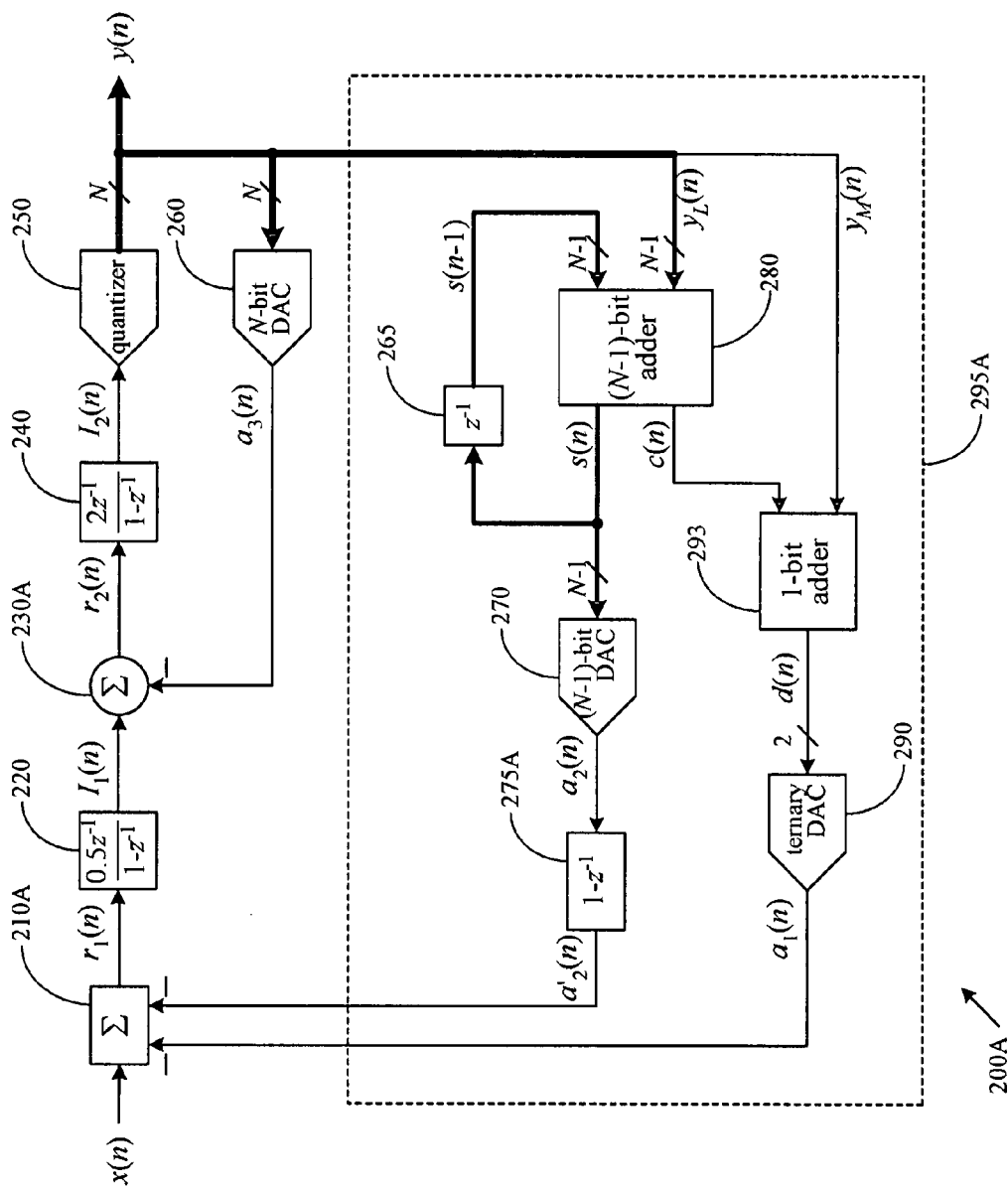
FIG. 2A illustrates a functional block diagram of a first embodiment of a multi-bit delta-sigma modulator comprising a ternary DAC in a feedback path.

FIG. 2A illustrates a multi-bit delta-sigma modulator 200A in accordance with one embodiment of the present invention. The multi-bit delta-sigma modulator 200A comprises a first summation circuit 210A that generates a first intermediate signal $r_1(n)$ based on a summation of a first set of signals. For example, the first summation circuit 210A subtracts a first feedback signal $a_1(n)$ and a second feedback signal $a'_2(n)$ from a modulator input signal $x(n)$ to generate the first intermediate signal $r_1(n)$. The first intermediate signal $r_1(n)$ is integrated by a first integrator circuit 220 to generate a first integrated signal $I_1(n)$. By way of example, the first integrator circuit 220 has a transfer function of about $0.5z^{-1}/(1-z^{-1})$. The first integrated signal $I_1(n)$ is provided to a second summation circuit 230A that generates a second intermediate signal $r_2(n)$ based on a weighted sum of a second set of signals. For example, the second summation circuit 230A subtracts a third feedback signal (or local feedback signal) $a_3(n)$ from the first integrated signal $I_1(n)$ to generate the second intermediate signal $r_2(n)$.

The multi-bit delta-sigma modulator 200A further comprises a filter circuit 240 to process the second intermediate signal $r_2(n)$ to generate a filtered signal $I_2(n)$. FIG. 2A shows the filter circuit 240 comprising a second integrator to illustrate an example of a second order delta-sigma modulator, but the filter circuit 240 can include additional integrators and summation circuits to increase the order of the modulator. Furthermore, the first integrator circuit 220 and the integrator of the filter circuit 240 are shown as discrete-time integrators, but the present invention is also applicable to continuous-time integrators. By way of example, the filter circuit 240 has a transfer function of about $2z^{-1}/(1-z^{-1})$. The filtered signal (or second integrated signal) $I_2(n)$ is provided to an N-bit quantizer 250 that digitizes the filtered signal $I_2(n)$ to generate an N-bit modulator output signal $y(n)$. N is preferably an integer greater than one.

The multi-bit delta-sigma modulator 200A comprises multiple feedback circuits. A first feedback circuit 295A generates the first feedback signal $a_1(n)$ and second feedback signal $a'_2(n)$ that is provided to the first summation circuit 210A. A second feedback circuit 260 generates the third feedback signal $a_3(n)$ that is provided to the second summation circuit 230A. Additional feedback circuits can be used to generate additional feedback signals for the first summation circuit 210A, the second summation circuit 230A or additional summation circuits in the filter circuit 240. In one embodiment, the second feedback circuit 260 and any additional feedback circuits are N-bit DACs with inputs coupled to the N-bit modulator output signal $y(n)$.

In one embodiment, the first feedback circuit 295A comprises an (N−1)-bit adder 280, a delay circuit (e.g., a unit-sample delay element) 265, an (N−1)-bit DAC 270, a differentiator 275A, a 1-bit adder 293 and a ternary DAC 290. The (N−1)-bit adder 280 along with the delay circuit 265 perform a cumulative summation on (N−1) least significant bits of the N-bit modulator output signal (i.e., $y_L(n)$) to generate an (N−1)-bit sum signal $s(n)$ and a 1-bit carry signal $c(n)$. The (N−1)-bit sum signal $s(n)$ is provided to the delay circuit 265 to generate a delayed sum signal $s(n-1)$ that is provided to an input of the (N−1)-bit adder 280. The (N−1)-bit sum signal $s(n)$ is also provided to the (N−1)-bit DAC 270 to generate an analog output $a_2(n)$ that is further processed by the differentiator 275A to be the second feedback signal $a'_2(n)$. The 1-bit carry signal $c(n)$ and a most significant bit of the N-bit modulator output signal (i.e., $y_M(n)$) is provided to the 1-bit adder 293 to generate a 2-bit ternary signal $d(n)$. The ternary DAC 290 processes the ternary signal $d(n)$ to generate the first feedback signal $a_1(n)$.

Figure 1:
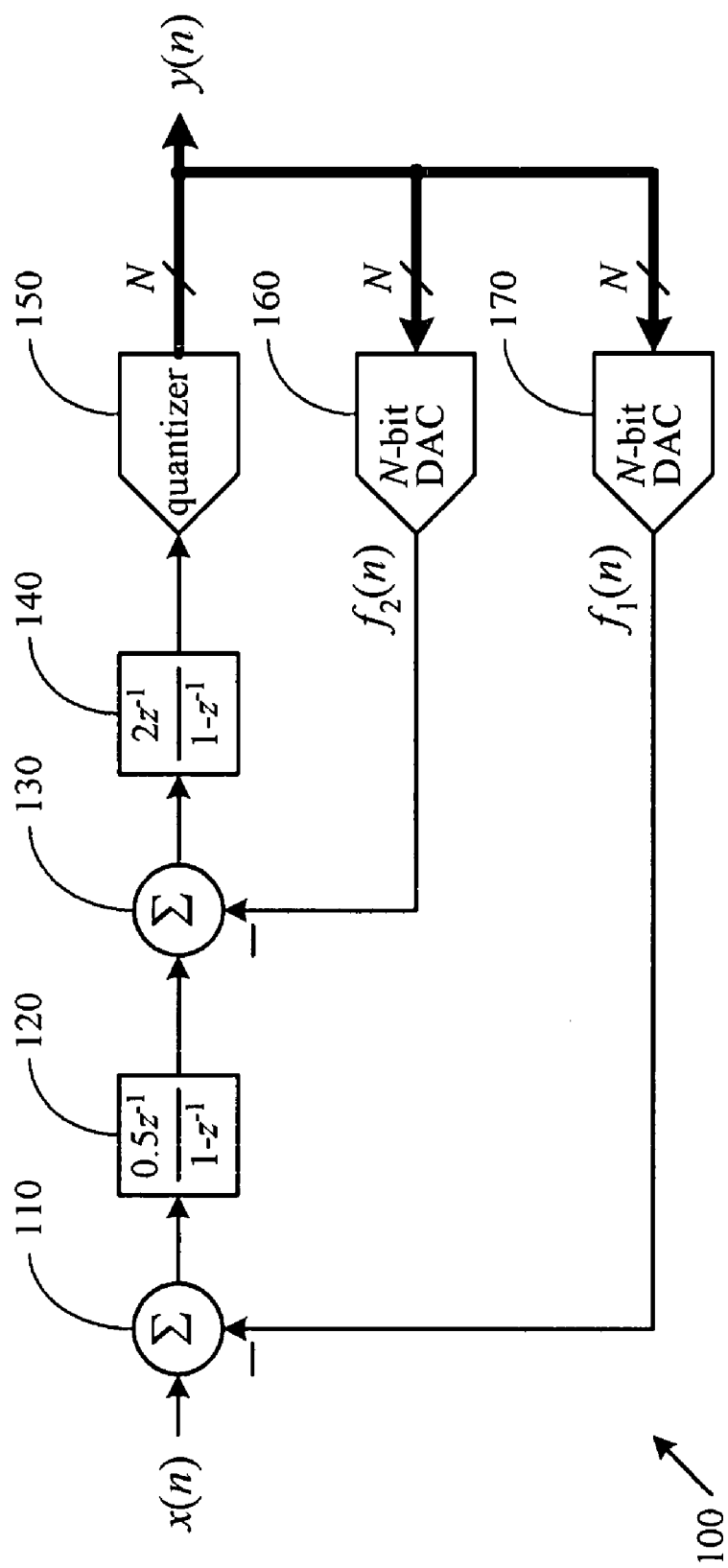
FIG. 1 illustrates a functional block diagram of a prior art second order multi-bit delta-sigma modulator.

In comparing the multi-bit delta-sigma modulator 200A in FIG. 2A to the multi-bit delta-sigma modulator 100 in FIG. 1, one of the changes is that the first feedback circuit 295A is used to substantially replace the first N-bit DAC 170. The following discussion illustrates how the first feedback circuit 295A with the ternary DAC 290 and the (N−1)-bit DAC 270 functions in a similar manner and is mathematically equivalent to the first N-bit DAC 170.

For example, the N-bit modulator output signal $y(n)$ has $2^N$ possible values: $\{0, 1, 2, \ldots 2^{N-1}\}$. Assuming for now that all of the DACs in FIGS. 1 and 2A are ideal and the weight of a least significant bit (LSB) is approximately $\Delta$, the first feedback signal $f_1(n)$ in the modulator 100 of FIG. 1 is defined by the following equation:

$$f_1(n) = y(n) \cdot \Delta \tag{1}$$

In the modulator of FIG. 2A, the second feedback signal $a'_2(n)$ is obtained by performing a differentiation operation $(1-z^{-1})$ on the analog output $a_2(n)$ from the (N−1)-bit DAC 270. The second feedback signal in FIG. 2A is defined by the following equation:

$$a'_2(n) = a_2(n) - a_2(n-1) \tag{2}$$

The (N−1) least significant bits of the N-bit modulator output signal and the most significant bit of the N-bit modulator output signal can be represented by the following mathematical expressions:

$$y_L(n) = \mathrm{mod}(y(n), 2^{N-1}) \tag{3}$$

$$y_M(n) = [y(n) - y_L(n)]/2^{N-1} \tag{4}$$

The (N−1)-bit adder 280 along with the unit-sample delay 265 perform a cumulative summation on the (N−1) least significant bits of the N-bit modulator output signal to generate the (N−1)-bit sum signal $s(n)$ and the 1-bit carry signal $c(n)$. The (N−1)-bit sum signal $s(n)$ and the 1-bit carry signal $c(n)$ can be represented by the following mathematical expressions:

$$s(n) = \mathrm{mod}(y_L(n) + s(n-1), 2^{N-1}) \tag{5}$$

$$c(n) = [y_L(n) + s(n-1) - s(n)]/2^{N-1} \tag{6}$$

The 2-bit ternary signal $d(n)$ is a sum of $c(n)$ and $y_M(n)$ as shown in the following equation:

$$d(n) = c(n) + y_M(n) \tag{7}$$

The weight of the LSB of the (N−1)-bit sum signal $s(n)$ is also approximately $\Delta$, but the weight of the 1-bit carry signal $c(n)$ is approximately $2^{N-1}$ times higher since it represents the carry from the (N−1)-bit adder 280. The weight of $y_M(n)$ is also $2^{N-1}$ times higher since it is the most significant bit of the N-bit modulator output signal $y(n)$. Thus, the analog output signal $a_2(n)$ from the (N−1)-bit DAC 270 and the first feedback signal $a_1(n)$ in FIG. 2A can be represented by the following mathematical expressions:

$$a_2(n) = s(n) \cdot \Delta \tag{8}$$

$$a_1(n) = d(n) \cdot (2^{N-1}\Delta) = [c(n) + y_M(n)] \cdot (2^{N-1}\Delta) \tag{9}$$

Based on equations (2) and (8), the second feedback signal $a'_2(n)$ in FIG. 2A can be rewritten as follows:

$$a'_2(n) = a_2(n) - a_2(n-1) = s(n)\Delta - s(n-1)\Delta \tag{10}$$

Based on equations (10), (9), (6) and (4), the second feedback signal $a'_2(n)$ in FIG. 2A can be simplified as follows:

$$\begin{aligned} a'_2(n) + a_1(n) &= s(n)\Delta - s(n-1)\Delta + c(n) \cdot (2^{N-1}\Delta) + \\ & \quad y_M(n) \cdot (2^{N-1}\Delta) \\ &= s(n)\Delta - s(n-1)\Delta + [y_L(n) + s(n-1) - s(n)] \cdot \end{aligned} \tag{11}$$

-continued $$\Delta + y(n) \cdot \Delta - y_L(n) \cdot \Delta$$
$$= y(n) \cdot \Delta$$

From equations (1) and (11), the first feedback signal $f_1(n)$ in FIG. 1 is shown to be mathematically equivalent to a summation of the first feedback signal $a_1(n)$ and the second feedback signal $a'_2(n)$ in FIG. 2A. Thus, the first feedback circuit 295A in FIG. 2A with the ternary DAC 290 and the (N−1)-bit DAC 270 is functionally equivalent to the first N-bit DAC 170 in FIG. 1 if all of the DACs are ideal.

$$f_1(n) = a'_2(n) + a_1(n) \tag{12}$$

When DACs are not ideal, the multi-bit delta-sigma modulator 200A of FIG. 2A with the first feedback circuit 295A performs better than the multi-bit delta-sigma modulator 100 of FIG. 1. In the multi-bit delta-sigma modulator 100 of FIG. 1, circuit errors from the first N-bit DAC 170 introduce additional noises at the input of the first summation circuit 110. These additional noises are affected by the same transfer characteristics as the modulator input signal, and thus in-band components of the additional noises cannot be suppressed at the modulator output.

The multi-bit delta-sigma modulator 200A of FIG. 2A can suppress DAC circuit errors. For example, circuit errors from the (N−1)-bit DAC 270 introduce additional noises at the input of the differentiator 275A and the additional noises are subject to high-pass filtering by the differentiator 275A before being combined with the modulator input signal at the first summation circuit 210A. Thus, in-band components of the additional noises due to the (N−1)-bit DAC 270 can be suppressed at the modulator output.

The output of the ternary DAC 290 is provided to the first summation circuit 210A. Thus, any circuit errors from the ternary DAC 290 will introduce additional noises at the input of the first summation circuit 210A. Any additional noises will be affected by the same transfer characteristics as the modulator input signal. Thus, the in-band components of any additional noises from the ternary DAC 290 cannot be suppressed at the modulator output. However, the ternary DAC 290 can be inherently linear with minimal non-linearity related circuit errors when implemented in a fully differential circuit topology. Therefore, the modulator output signal in FIG. 2A can be relatively free of noises due to circuit errors in feedback DACs.

Figure 2B:
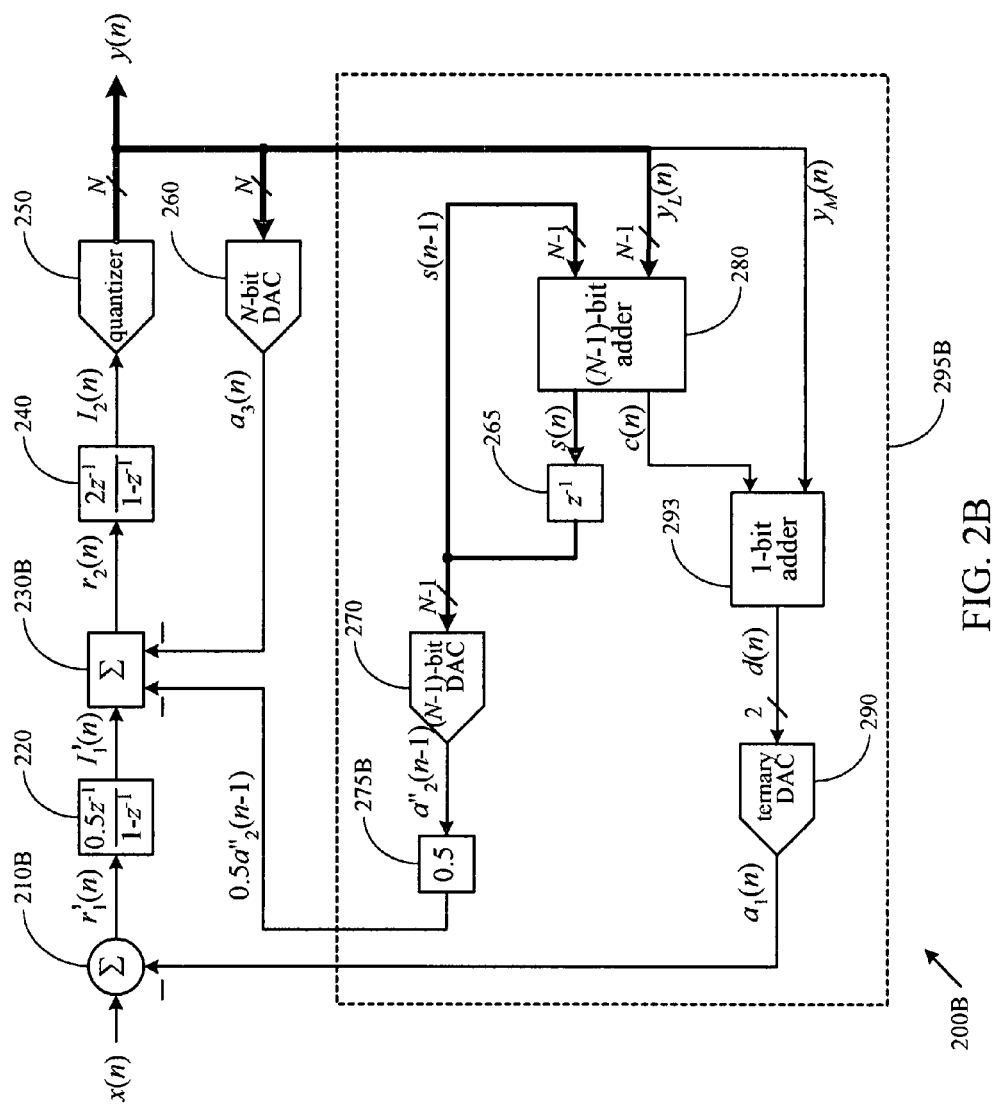
FIG. 2B illustrates a functional block diagram of a second embodiment of a multi-bit delta-sigma modulator comprising a ternary DAC in a feedback path.

FIG. 2B illustrates another embodiment of a multi-bit delta-sigma modulator 200B that advantageously eliminates the differentiator 275A. In FIG. 2A, the differentiator 275A is followed by the first integrator circuit 220. A differentiator followed by an integrator effectively does nothing to a signal, aside from introducing a delay and a possible scaling factor. For example, the combined effect of the differentiator 275A and the first integrator circuit 220 in FIG. 2A to the analog output $a_2(n)$ is $0.5z^{-1}$ (i.e., a scaling by a factor of 0.5 together with a unit-sample delay). Thus, the differentiator 275A can be removed by bypassing the first integrator circuit 220 and introducing a proper scaling and delay to the analog output $a_2(n)$ of the (N−1)-bit DAC 270.

In FIG. 2B, a first summation circuit 210B generates a first intermediate signal $r'_1(n)$ based on a summation of a modulator input signal $x(n)$ and a first feedback signal $a_1(n)$. The first intermediate signal $r'_1(n)$ is integrated by a first integrator circuit 220 to generate a first integrated signal $I'_1(n)$. The first integrated signal $I'_1(n)$ is provided to a second summation circuit 230B that generates a second intermediate signal $r_2(n)$ based on a weighted sum of a second set of signals. For example, the second summation circuit 230B subtracts a second feedback signal $0.5a''_2(n-1)$ and a third feedback signal $a_3(n)$ from the first integrated signal $I'_1(n)$ to generate the second intermediate signal $r_2(n)$. The second intermediate signal $r_2(n)$ is processed by the filter circuit 240 to generate the filtered signal $I_2(n)$. The filter signal (or second integrated signal) $I_2(n)$ is provided to an N-bit quantizer 250 that digitizes the filter signal $I_2(n)$ to generate an N-bit modulator output signal $y(n)$.

The multi-bit delta-sigma modulator 200B comprises a first feedback circuit 295B that generates the first feedback signal $a_1(n)$ for the first summation circuit 210B and the second feedback signal $0.5a''_2(n-1)$ for the second summation circuit 230B. A second feedback circuit (e.g., an N-bit DAC) 260 generates the third feedback signal $a_3(n)$ that is also provided to the second summation circuit 230B.

In one embodiment, the first feedback circuit 295B comprises an (N−1)-bit adder 280, a delay circuit 265, an (N−1)-bit DAC 270, a scaling factor 275B, a 1-bit adder 293 and a ternary DAC 290. The (N−1)-bit adder 280 along with the delay circuit 265 perform a cumulative summation on (N−1) least significant bits of the N-bit modulator output signal (i.e., $y_L(n)$) to generate an (N−1)-bit sum signal $s(n)$ and a 1-bit carry signal $c(n)$. The (N−1)-bit sum signal $s(n)$ is provided to the delay circuit 265 to generate a delayed sum signal $s(n-1)$ that is provided to an input of the (N−1)-bit adder 280. The delayed sum signal $s(n-1)$ is also provided to the (N−1)-bit DAC 270 to generate a delayed analog output $a''_2(n-1)$ that is scaled by the scaling factor 275B to be the second feedback signal $0.5a''_2(n-1)$. The 1-bit carry signal $c(n)$ and a most significant bit of the N-bit modulator output signal (i.e., $y_M(n)$) is provided to the 1-bit adder 293 to generate a 2-bit ternary signal $d(n)$. The ternary DAC 290 processes the ternary signal $d(n)$ to generate the first feedback signal $a_1(n)$.

The multi-bit delta-sigma modulator 200B of FIG. 2B functions equivalently as the multi-bit delta-sigma modulator 200A of FIG. 2A. The first feedback circuit 295B of FIG. 2B advantageously eliminates the differentiator 275B used in the first feedback circuit 295A of FIG. 2A by providing the delayed sum signal $s(n-1)$ to the (N−1)-bit DAC 270, properly scaling the analog output of the (N−1)-bit DAC 270, and providing the resulting second feedback signal to the second summation circuit 230B rather than the first summation circuit 210B.

Figure 2C:
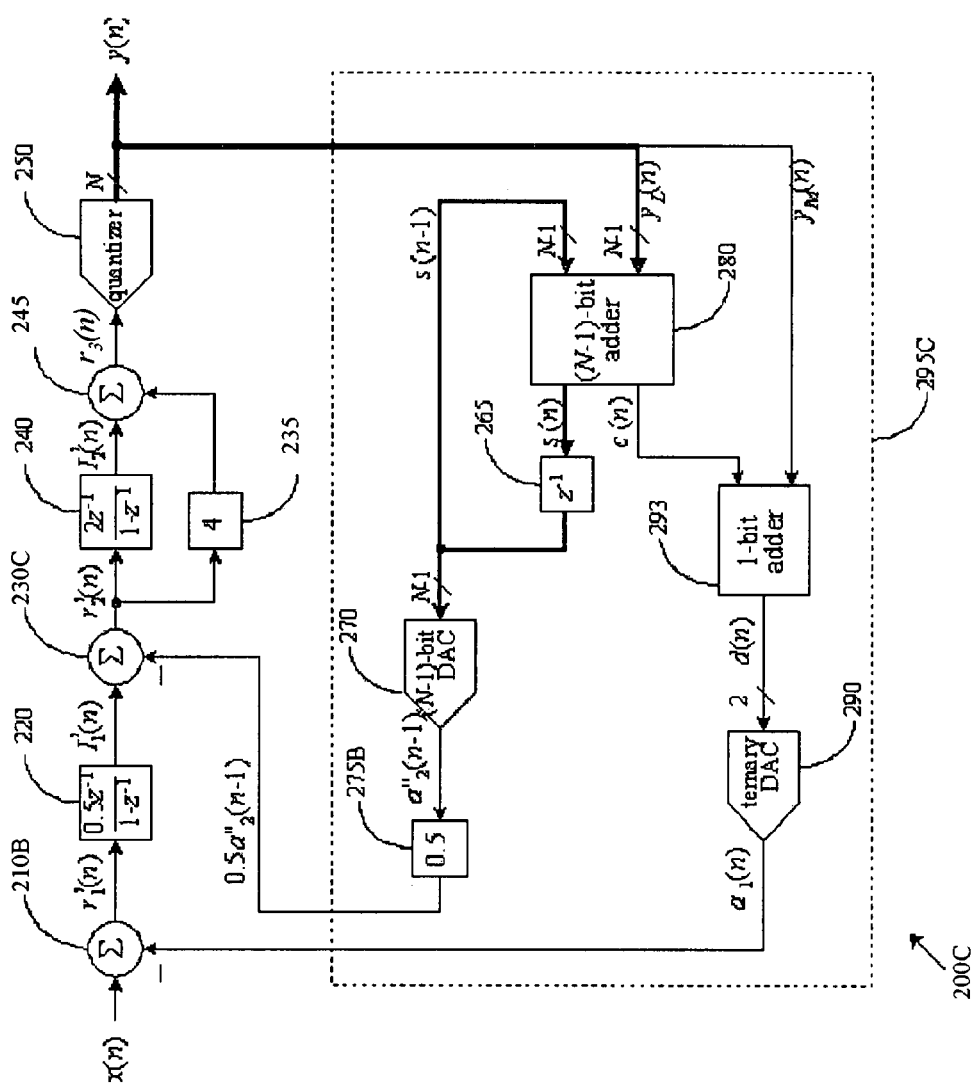
FIG. 2C illustrates a functional block diagram of a third embodiment of a multi-bit delta-sigma modulator comprising a ternary DAC in a feedback path.

FIG. 2C illustrates yet another embodiment of a multi-bit delta-sigma modulator 200C. The multi-bit delta-sigma modulator 200C of FIG. 2C is substantially similar to the multi-bit delta-sigma modulator 200B of FIG. 2B except the second feedback circuit 260 is eliminated and a feed forward path is added. The present invention is applicable to multi-bit delta-sigma modulators that use feed forward compensation, local feedback compensation or a combination of both.

By way of example, FIG. 2C shows a multi-bit delta-sigma modulator 200C with a feed forward path that bypasses the filter circuit 240 comprising at least one integrator circuit. The feed forward path comprises a gain block 235 that receives an input from an output of a second summation circuit 230C (or an input of the filter circuit 240) and generates a feed forward signal that is combined with an output of the filter circuit 240 at a third summation circuit 245. This feed forward path is functionally equivalent to the local feedback path comprising the N-bit DAC 260 in FIG. 2B. Other feed forward paths that bypass the first integrator circuit 220 or other integrator circuits (not shown) are also possible.

Figure 3:
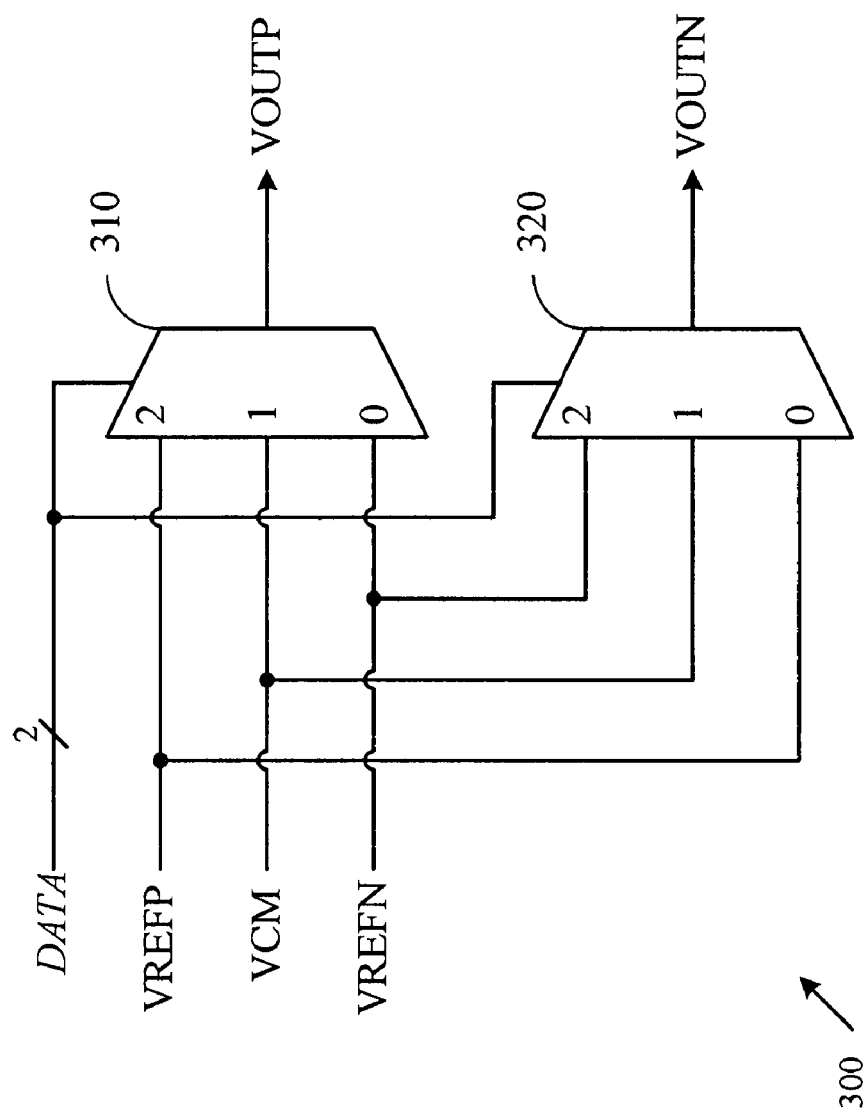
FIG. 3 illustrates one embodiment of a voltage-mode ternary DAC.

FIG. 3 illustrates one embodiment of a ternary DAC 300 implemented in a fully differential circuit topology. The ternary DAC 300 receives a 2-bit ternary signal (or control word DATA) having three possible values (e.g., 0, 1, 2) and outputs a corresponding differential signal comprising a positive end (VOUTP) and a negative end (VOUTN). The ternary DAC 300 uses three reference voltages: VREFP, VCM and VREFN. The positive end of the differential signal is coupled to one of the three reference voltages via a first multiplexer 310 and the negative end of the differential signal is coupled to one of the three reference voltages via a second multiplexer 320. The multiplexers 310, 320 are controlled by the control word DATA. The output of the ternary DAC 300 is the voltage difference between the positive end and the negative end (i.e., the respective outputs of the multiplexers 310, 320). Table 1 shows the possible outputs of the ternary DAC 300. The three possible outputs of the ternary DAC 300 are uniformly spaced. Thus, the ternary DAC 300 is inherently linear regardless of the values of reference voltages.

TABLE 1

| DATA | VOUTP | VOUTN | DAC OUTPUT |
|---|---|---|---|
| 0 | VREFN | VREFP | VREFN-VREFP |
| 1 | VCM | VCM | 0 |
| 2 | VREFP | VREFN | VREFP-VREFN |

Figure 4:
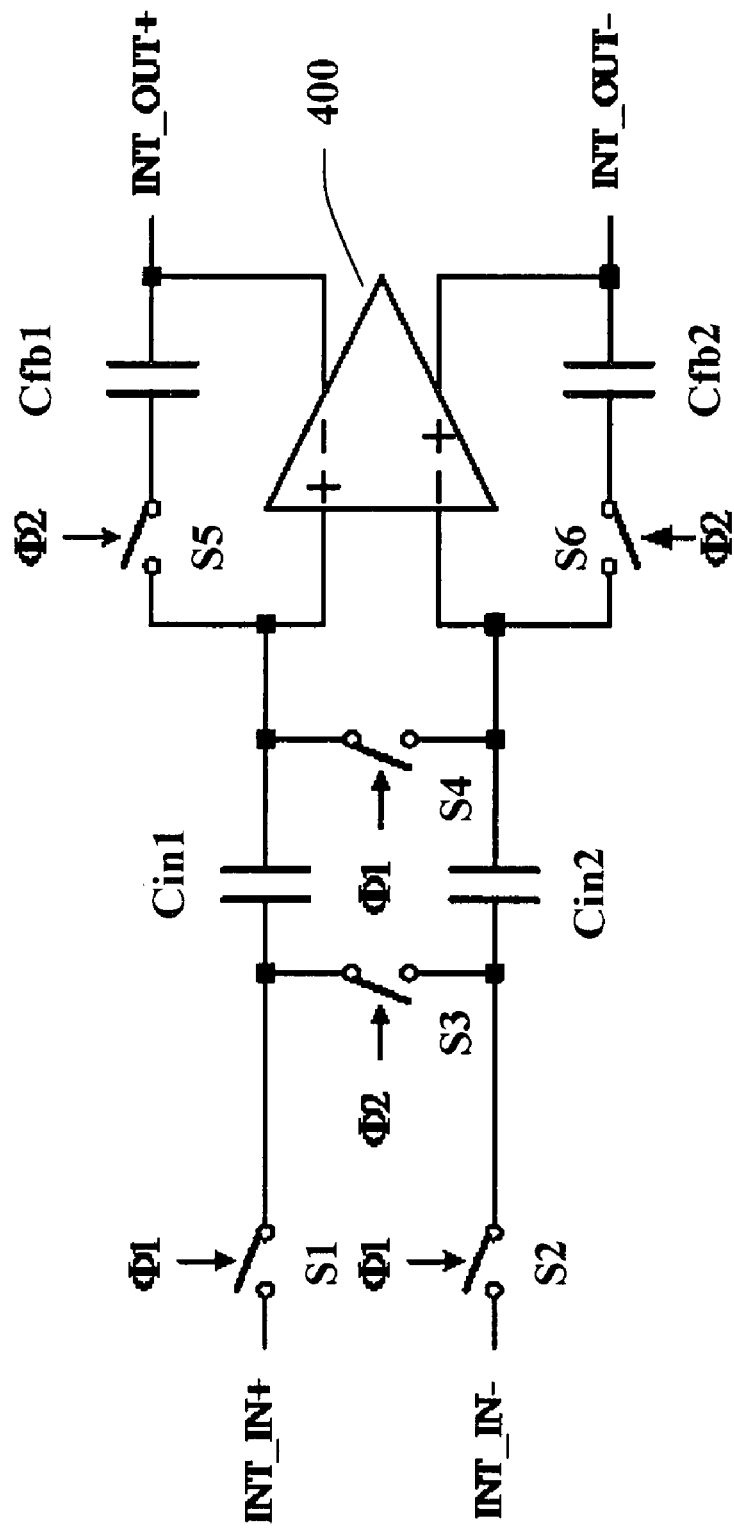
FIG. 4 illustrates one embodiment of a discrete-time integrator.

FIG. 4 illustrates one embodiment of a discrete-time integrator implemented as a fully differential switch-capacitor integrator. A pair of input capacitors (Cin1, Cin2) is coupled to inputs of a fully differential operational amplifier 400. A pair of feedback capacitors (Cfb1, Cfb2) is coupled to outputs of the fully differential operational amplifier 400. A plurality of switches are controlled by a plurality of clock signals to implement the discrete-time integrator function.

Figure 5:
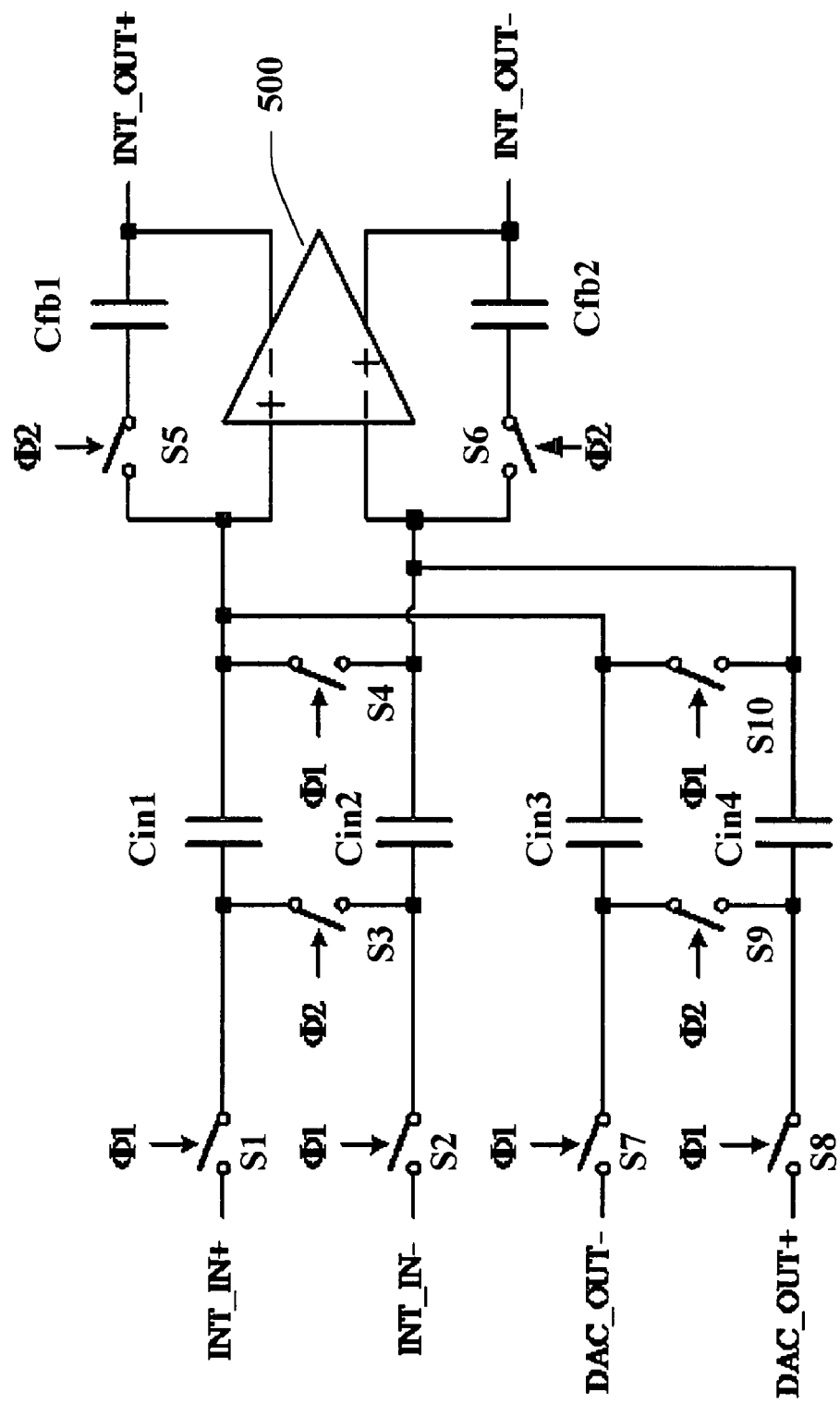
FIG. 5 illustrates one embodiment of a differential switch-capacitor circuit that combines the functionalities of a summation circuit and an integrator circuit.

FIG. 5 illustrates one embodiment of an integrator circuit that includes a summation circuit function. The integrator circuit is implemented using a discrete-time integrator topology. A summation circuit that precedes the integrator circuit and is configured to receive a feedback signal from a DAC can be effectively combined with the integrator into a single fully differential switch-capacitor circuit similar to the one shown in FIG. 5. For example, the first summation circuit 210B and the first integrator 220 can be combined in a single fully differential switch-capacitor circuit that has a first pair of input capacitors (e.g., Cin1, Cin2) for receiving the modulator input signal and a second pair of input capacitors (e.g., Cin3, Cin4) for receiving the first feedback signal generated by a DAC. The second summation circuit 230B can also be combined with the second integrator in the filter circuit 240 in a single fully differential switch-capacitor circuit with a first pair of input capacitors for receiving the first integrated signal, a second pair of input capacitors for receiving the second feedback signal and a third pair of input capacitors for receiving the third feedback signal. In one embodiment, the scaling factor 275B can also be included in the switch-capacitor circuit by setting the capacitor ratios between the pairs of input capacitors.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi-bit delta-sigma modulator comprising:
    a first summation circuit configured to generate a first intermediate signal based on a summation of a first set of signals including a modulator input signal and a first feedback signal;
    a first integrator circuit configured to integrate the first intermediate signal to generate a first integrated signal;
    a second summation circuit configured to generate a second intermediate signal based on a weighted sum of a second set of signals including the first integrated signal and a second feedback signal;
    a filter circuit configured to process the second intermediate signal to generate a filtered signal, wherein the filter circuit includes a second integrator circuit;
    a quantizer configured to digitize the filtered signal to generate an N-bit modulator output signal, wherein N is an integer greater than one; and
    a feedback circuit configured to receive the N-bit modulator output signal and to generate the first feedback signal and the second feedback signal using a ternary digital-to-analog converter and an (N−1)-bit digital-to-analog converter, respectively.

2. The multi-bit delta-sigma modulator of claim 1, wherein the feedback circuit further comprises:
    an (N−1)-bit accumulator configured to receive (N−1) least significant bits of the N-bit modulator output signal to generate an (N−1)-bit cumulative sum signal and a 1-bit carry signal, wherein the (N−1)-bit cumulative sum signal is coupled to an input of the (N−1)-bit digital-to-analog converter; and
    a 1-bit adder configured to receive a most significant bit of the N-bit modulator output signal and the 1-bit carry signal to generate a 2-bit ternary signal that is coupled to an input of the ternary digital-to-analog converter.

3. The multi-bit delta-sigma modulator of claim 1, wherein the second set of signals further includes a third feedback signal.

4. The multi-bit delta-sigma modulator of claim 3, further comprising an N-bit digital-to-analog converter configured to receive the N-bit modulator output signal and to generate the third feedback signal.

5. The multi-bit delta-sigma modulator of claim 1, wherein the filter circuit further comprises a third summation circuit configured to generate a third intermediate signal based on a weighted sum of a third set of signals including an output of the second integrator circuit and an input of the second integrator circuit.

6. The multi-bit delta-sigma modulator of claim 1, wherein the filter circuit further comprises a third summation circuit configured to generate a third intermediate signal based on a weighted sum of a third set of signals including an output of the second integrator circuit and an output of the second summation circuit.

7. The multi-bit delta-sigma modulator of claim 1, wherein the first integrator circuit and the second integrator circuit are discrete-time integrators, each of the discrete-time integrators comprising a differential switch-capacitor integrator comprising a pair of input capacitors, a differential operational amplifier, a pair of feedback capacitors and a plurality of switches controlled by a plurality of clock signals.

8. The multi-bit delta-sigma modulator of claim 1, wherein the first integrator circuit and the second integrator circuit are continuous-time integrators.

9. The multi-bit delta-sigma modulator of claim 1, wherein the filter circuit further comprises at least one additional summation circuit and at least one additional integrator circuit to increase an order of the multi-bit delta-sigma modulator.

10. The multi-bit delta-sigma modulator of claim 1, wherein the ternary digit-to-analog converter is implemented in a differential circuit topology comprising a first 3-to-1 multiplexer to generate a positive end of a differential signal and a second 3-to-1 multiplexer to generate a negative end of the differential signal, a 2-bit input signal to the ternary digital-to-analog converter is provided to select lines of the multiplexers, and three reference voltages are provided in a different order to input terminals for each of the multiplexers.

11. The multi-bit delta-sigma modulator of claim 1, wherein the first summation circuit is combined with the first integrator circuit in a single differential switch-capacitor circuit comprising a first pair of capacitors for coupling to the modulator input signal, a second pair of capacitors for coupling to an output the ternary digital-to-analog converter, a pair of feedback capacitors, a differential operational amplifier and a plurality of switches controlled by a plurality of clock signals.

12. The multi-bit delta-sigma modulator of claim 1, wherein the second summation circuit is combined with the second integrator circuit in a single switch-capacitor circuit and the weighted sum of the second set of signals is implemented by setting a capacitor ratio in the single switch-capacitor circuit.

13. A method of suppressing circuit errors in a multi-bit delta-sigma modulator, the method comprising:
    performing a first weighted summation on a first set of signals including a modulator input signal and a first feedback signal to generate a first intermediate signal;
    integrating the first intermediate signal to generate a first integrated signal;
    performing a second weighted summation on a second set of signals including the first integrated signal and a second feedback signal to generate a second intermediate signal;
    filtering the second intermediate signal to generate a filtered signal;
    digitizing the filtered signal to generate an N-bit modulator output signal, wherein N is an integer greater than one;
    performing a cumulative summation on (N−1) least significant bits of the N-bit modulator output signal to generate an (N−1)-bit sum signal and a 1-bit carry signal; and
    adding the 1-bit carry signal to a most significant bit of the N-bit modulator output signal to generate a 2-bit ternary signal; and
    converting the 2-bit ternary signal into the first feedback signal using a ternary digital-to-analog converter.

14. The method of claim 13, further comprising converting the (N−1)-bit sum signal into the second feedback signal using a feedback path comprising an (N−1)-bit digital-to-analog converter.

15. The method of claim 13, wherein the step of performing a cumulative summation on (N−1) least significant bits of the N-bit modulator output signal further comprises:
    using an (N−1)-bit adder to add the (N−1) least significant bits of the N-bit modulator output signal with the (N−1)-bit sum signal; and
    delaying an output of the (N−1)-bit adder to generate the (N−1)-bit sum signal.

16. The method of claim 13, wherein the second set of signals further comprises a third feedback signal generated by performing a digital-to-analog conversion of the N-bit modulator output signal.

17. The method of claim 13, wherein filtering the second intermediate signal comprises performing an integration of the second intermediate signal.

18. A multi-bit delta-sigma modulator comprising:
    means for processing a modulator input signal with at least a first feedback signal, a second feedback signal and a compensation signal to generate a filtered signal, wherein the compensation signal comprises at least one of the following: a third feedback signal and a feed forward signal;
    means for digitizing the filtered signal to generate an N-bit modulator output signal, wherein N is an integer greater than one;
    means for performing a cumulative summation on (N−1) least significant bits of the N-bit modulator output signal to generate an (N−1)-bit sum signal and a 1-bit carry signal;
    means for adding the 1-bit carry signal to a most significant bit of the N-bit modulator output signal to generate a 2-bit ternary signal; and
    means for converting the 2-bit ternary signal into the first feedback signal.

19. The multi-bit delta-sigma modulator of claim 18, further comprising means for converting the (N−1)-bit sum signal into the second feedback signal.

20. The multi-bit delta-sigma modulator of claim 18, further comprising means for converting the N-bit modulator output signal into the third feedback signal.

* * * * *

UNITED STATES PATENT AND TRADEMARK OFFICE
CERTIFICATE OF CORRECTION

PATENT NO.        : 7,446,687 B2
APPLICATION NO. : 11/856638
DATED             : November 4, 2008
INVENTOR(S)       : Chia-Liang Lin It is certified that error appears in the above-identified patent and that said Letters Patent is hereby corrected as shown below:

At column 2, line 3, under Other Publications change "Resoulation" and insert -- Resolution --.

At column 5, line 27, change "$2z{-}^{-1}/(1{-}z^{-1})$." and insert -- $2z^{-1}/(1{-}z^{-1})$ --.

Signed and Sealed this

Fourteenth Day of April, 2009

JOHN DOLL
*Acting Director of the United States Patent and Trademark Office*